(12) United States Patent
Erbert et al.

(10) Patent No.: US 10,833,478 B2
(45) Date of Patent: Nov. 10, 2020

(54) WAVEGUIDE STRUCTURE AND OPTICAL SYSTEM WITH WAVEGUIDE STRUCTURE

(71) Applicant: FORSCHUNGSVERBUND BERLIN E.V., Berlin (DE)

(72) Inventors: Götz Erbert, Löbau (DE); Jörg Fricke, Berlin (DE); Andre Müller, Berlin (DE); Hans Wenzel, Berlin (DE); Bernd Sumpf, Wildau (DE); Katrin Paschke, Michendorf (DE)

(73) Assignee: FORSCHUNGSVERBUND BERLIN E.V., Berlin (DE)

( * ) Notice: Subject to any disclaimer, the term of this patent is extended or adjusted under 35 U.S.C. 154(b) by 0 days.

(21) Appl. No.: 16/327,419

(22) PCT Filed: Aug. 21, 2017

(86) PCT No.: PCT/EP2017/071030
§ 371 (c)(1),
(2) Date: Mar. 12, 2019

(87) PCT Pub. No.: WO2018/036964
PCT Pub. Date: Mar. 1, 2018

(65) Prior Publication Data
US 2019/0273359 A1 Sep. 5, 2019

(30) Foreign Application Priority Data

Aug. 24, 2016 (DE) .......... 10 2016 115 723

(51) Int. Cl.
*H01S 5/10* (2006.01)
*G02B 6/122* (2006.01)
(Continued)

(52) U.S. Cl.
CPC ............ *H01S 5/1014* (2013.01); *G02B 6/124* (2013.01); *G02B 6/1228* (2013.01); *H01S 5/101* (2013.01);
(Continued)

(58) Field of Classification Search
CPC ........ H01S 5/1014; H01S 5/125; H01S 5/101; H01S 2301/166; H01S 2301/163; G02B 6/124; G02B 6/1228
See application file for complete search history.

(56) References Cited

U.S. PATENT DOCUMENTS

| 5,652,812 A | 7/1997 | Gurib et al. |
| 5,793,521 A | 8/1998 | O'Brien et al. |

(Continued)

FOREIGN PATENT DOCUMENTS

WO 2015/107960 A1 7/2015

OTHER PUBLICATIONS

International Search Report dated Dec. 4, 2017, dated Dec. 13, 2017.
(Continued)

*Primary Examiner* — Yuanda Zhang
(74) *Attorney, Agent, or Firm* — Norris McLaughlin, P.A.

(57) ABSTRACT

The inventive waveguide structure comprises a first waveguide region having a constant first width adapted to guide electromagnetic waves mode sustainably along its longitudinal axis; a second waveguide region adapted to guide electromagnetic waves mode sustainably along its longitudinal axis, wherein the longitudinal axis of the first waveguide region and the longitudinal axis of the second waveguide region form a common longitudinal axis of the waveguide structure, wherein a first end face of the first waveguide region and a first end face of the second waveguide region are aligned with each other, the width of the
(Continued)

first end face of the second waveguide region corresponding to the first width, and the width of the second waveguide region along its longitudinal axis widens from the first end face to a second end face to a second width greater than the first width.

10 Claims, 5 Drawing Sheets

(51) Int. Cl.
  *G02B 6/124* (2006.01)
  *H01S 5/125* (2006.01)
(52) U.S. Cl.
  CPC ........ *H01S 5/125* (2013.01); *H01S 2301/163* (2013.01); *H01S 2301/166* (2013.01)

(56) References Cited

U.S. PATENT DOCUMENTS

| | | |
|---|---|---|
| 6,600,764 B1 | 7/2003 | Garbuzov et al. |
| 2003/0031222 A1 | 2/2003 | Balsamo et al. |
| 2012/0177077 A1 | 7/2012 | Erbert et al. |
| 2015/0288140 A1 | 10/2015 | Davies et al. |
| 2016/0344161 A1* | 11/2016 | Kondo ...................... H01S 5/14 |
| 2016/0372891 A1 | 12/2016 | Kondo et al. |
| 2017/0047711 A1* | 2/2017 | Kondo ..................... G02B 6/42 |

OTHER PUBLICATIONS

English translation of International Search Report dated Dec. 4, 2017, dated Dec. 13, 2017.

* cited by examiner

WAVEGUIDE STRUCTURE AND OPTICAL SYSTEM WITH WAVEGUIDE STRUCTURE

This application is the U.S. National Stage of International Application No. PCT/EP2017/071030, filed Aug. 21, 2017, which claims foreign priority benefit under 35 U.S.C. § 119 of German Application No. 10 2016 115 723.6 filed Aug. 24, 2016.

The invention concerns a waveguide structure and an optical system with a waveguide structure. In particular, this invention concerns the improvement of the reflectivity of a waveguide structure with an integrated reflection grating within the optical system of a semiconductor laser.

TECHNOLOGICAL BACKGROUND OF THE INVENTION

For the use of semiconductor lasers in many applications, such as material analysis (spectroscopy), interferometric surveying, in LIDAR systems as well as in telecommunications and material processing, the light emission must be single or monomodal with the lowest possible spectral bandwidth. Surface gratings, i.e. periodic surface structures generated by partial ablation (etching) of the semiconductor material of the waveguide layers, are a type of Bragg gratings frequently used in semiconductor lasers to stabilize the wavelength of the emitted laser light. These Bragg gratings are used as reflectors in semiconductor lasers. Due to the periodic structure, the reflectivity is strongly dependent on the wavelength and in combination with the optical gain of the material, the desired spectral behavior can be achieved. The best wavelength stability, especially over a wide temperature range, can be achieved by using the grating on the back of the resonator. For an efficient laser operation with low laser current threshold and high steepness on the output side, a high reflectivity of the Bragg grating, typically of 80% and more, is necessary.

For most of the applications mentioned above, the semiconductor laser must also oscillate spatially in basic mode operation. For guiding the electromagnetic waves within the semiconductor laser, narrow ridge or strip waveguides with widths of about 5 μm are usually used. It turned out, however, that the reflectivity of the surface gratings described above, when used in lasers with such narrow strip widths, only reaches values of a maximum of 60%, but typically only values of 30% and less. It can be assumed that in the narrow waveguides there is an interaction between the grating and the lateral waveguide, so that radiation losses occur which limit the reflectivity.

Rauter et al. ("Single-mode tapered quantum cascade lasers", Appl. Phys. Lett. 102, 181102 (2013)) reveals that by reducing the width of the ridge waveguide in the DBR region of a quantum cascade tapered laser, longitudinal and transverse filtering of laser modes can be performed for corresponding single mode operation of the tapered laser. DBR tapered diode lasers with integrated sixth order surface gratings based on simplified fabrication process", Proc. SPIE 6184, Semiconductor Lasers and Laser Dynamics II, 618401 (Apr. 14, 2006)).

It is therefore a task of the present invention to provide a waveguide structure and an optical system with a waveguide structure with an integrated grating, which overcome the described disadvantages of the state of the art and which, in particular, make it possible to increase the reflectivity of the Bragg grating to values greater than 80%, especially with a ridge waveguide laser designed for single mode operation. An inventive waveguide structure with increased grating reflectivity should be applicable for general optical systems as well as half-conductor lasers.

SUMMARY OF THE INVENTION

These tasks are solved according to the invention by the independent patent claims. Preferred forms of the invention are contained in the sub claims.

The invention waveguide structure comprises a first waveguide region with a constant first width, designed to guide electromagnetic waves along its longitudinal axis in a mode-preserving manner; a second waveguide region adapted to guide electromagnetic waves mode sustainably along its longitudinal axis, the longitudinal axis of the first waveguide region and the longitudinal axis of the second waveguide region forming a common longitudinal axis of the waveguide structure, a first end face of the first waveguide region and a first end face of the second waveguide region being aligned with one another, wherein the width of the first face of the second waveguide region corresponds to the first width, and the width of the second waveguide region widens along its longitudinal axis from the first face to a second face to a second width greater than the first width; and a grating having a plurality of webs and trenches, the grating being disposed along the common longitudinal axis in the second waveguide region. The second waveguide region and the grating are designed to guide electromagnetic waves in the second waveguide region along the common longitudinal axis in a mode-preserving manner and to reflect them in a mode-preserving manner. The first waveguide region, the second waveguide region and the grating are designed to guide electromagnetic waves in the first waveguide region and in the second waveguide region along the common longitudinal axis in a mode-preserving manner and to reflect them in a mode-preserving manner.

The width of a waveguide corresponds to the distance between opposing side areas of the waveguide and is determined perpendicular to the longitudinal axis of the waveguide. Constant width means that the width of the waveguide is essentially the same for each position along the longitudinal axis of the waveguide and fluctuations in the width of the waveguide are negligible. Preferably, the width of the waveguide varies by a maximum of 0.1%, less than 1% or less than 5% compared to an average width of the waveguide. Mode-preserving guidance means that a waveguide can carry an electromagnetic wave in at least one transverse propagation mode substantially stable along the longitudinal axis of the waveguide. Essentially stable means that when the electromagnetic wave is guided in at least one transverse propagation mode, only a negligible coupling to other waveguide modes occurs. Preferably, at least 99.9%, at least 98%, at least 95% or at least 90% of the energy coupled into this propagation mode remain in the respective modes during the propagation of electromagnetic waves along the longitudinal axis of a waveguide in the at least one mode-maintaining transversal propagation mode.

The end faces or facets of a waveguide are the areas of the waveguide formed for the input and output of electromagnetic waves. If a first face of the first waveguide region and a first face of the second waveguide region are aligned with each other, a coupling between the propagation modes of the two waveguide regions can occur. The end faces can be directly adjacent to each other or spaced apart from each other. Preferably the distance is smaller than the wavelength of an electromagnetic wave guided in the waveguide. A distance greater than 1/10 of the wavelength of an electromagnetic wave guided in the waveguide is preferred.

Preferably, the invention waveguide structure is characterized in that the second width exceeds the first width by more than 20%, more than 25%, more than 50%. Especially preferred the second width exceeds the first width by more than 100%, more than 200%, more than 500%, more than 1000%, or more than 2500%. Preferably, the second waveguide region has an overall length greater than 200 µm, greater than 500 µm, greater than 1000 µm or greater than 2500 µm. Preferably, the first waveguide region has a constant first width of greater than 1 µm, greater than 2 µm, greater than 5 µm, greater than 10 µm or greater than 25 µm. Preferably, an invented waveguide structure can have a first width between 2 µm and 5 µm and a second width between 18 µm and 22 µm. Also preferred is an inventive waveguide structure with a first width between 3 µm and 7 µm and a second width between 25 µm and 35 µm. Preferably, the waveguide structure is designed to guide electro-magnetic waves from the visible spectral range. Preferably, the invention-based waveguide structure is designed to guide electromagnetic waves from the infrared or ultraviolet spectral range. The waveguide structure is particularly preferred for guiding electromagnetic waves in the spectral range between 0.6 µm and 1.1 µm. Preferably, the first waveguide region is designed to conduct only a single transverse propagation mode.

The grating is preferably a Bragg reflection grating. Preferably the Bragg reflection grating is a surface grating. The shape of the trenches is preferably right-angled or tapering to a trench minimum (furrows). The webs are characterized by the fact that the webs connect the trench maxima of adjacent trenches with each other. In the case of furrows arranged as close as possible to each other, a web can also be defined via the point of contact of two adjacent furrow edges.

The second waveguide region and the grating are designed to guide electromagnetic waves in the second waveguide region along the common longitudinal axis in a mode-preserving manner and to reflect them in a mode-preserving manner. If, for example, the spatial ground-mode of the first waveguide region is excited at the free (second) end face of the first waveguide region, the corresponding electromagnetic waves are guided as spatial ground mode along the longitudinal axis of the first waveguide region, coupled into the second waveguide region in a mode-preserving manner, and are also continued there locally as spatial ground mode. The propagation direction of the mode is reversed by a reflection at the grating, so that after a renewed feedback into the first waveguide region at the free (second) end face of the first waveguide region, the spatial fundamental mode of the first waveguide region is also emitted again. The first waveguide region, the second waveguide region and the grating are thus designed to cause a mode-maintaining reversal of direction for at least one transverse propagation mode of the first waveguide region excited at the free (second) end face of the first waveguide region. Mode-preserving guidance and reflection can also be available for higher order propagation modes and for any superposition of such mode-preserving guided and reflected propagation modes.

The waveguide structure thus comprises a first waveguide region with a constant first width and a second waveguide region adjoining the first waveguide region and having a reflection grating integrated at least in sections, the width of the second waveguide region widening along its longitudinal axis from the first width to a second width greater than the first width. The second waveguide range may include sections of constant width, in particular an extended length section with a constant second width. The waveguide structure and in particular the transition area from the first width to the second width of the waveguide structure must meet the so-called adiabaticity criterion for the mode conservation of tapered (or widening) waveguide structures in order to preserve the mode. The adiabaticity criterion is used for example in Yunfei Fu et. al., "Efficient adiabatic silicon-on-insulator waveguide taper", Photon. Res. 2(3) (2014).

The idea of this invention is that the reflectivity of a grating section integrated into a waveguide, for example a Bragg grating integrated into a ridge waveguide, depends on its width, whereas the reflectivity of the grating increases with the width of the ridge waveguide (see FIG. 4). However, waveguides of small width, especially in ridge waveguide lasers designed for single mode operation, are a prerequisite for single mode operation with extremely narrow emission widths. Since the effective length of a grating integrated in the waveguide must be kept as short as possible in order to achieve the most compact and reliable resonator design possible, the required grating length can be reduced by increasing the reflectivity of the grating.

In particular, an inventive waveguide structure can be used to maximize the reflectivity of the back grating of the resonator of a semiconductor laser and thus to reduce the overall grating length required to achieve a certain reflectivity compared to a conventional laser structure or to achieve an increased reflectivity with a comparable grating length. A waveguide structure according to the invention can, however, also be arranged on the front side of such a semiconductor laser with lower reflectivity than a decoupling grating. This results in the technical advantage that the passive range of the laser can also be further shortened in this range due to the improved efficiency of the grating.

In accordance with the invention, an increase in the reflectivity of the grating is achieved by increasing the width of a waveguide structure exclusively in the region of the grating, with a transition taking place from a waveguide region with small width to a waveguide region with high width. However, it must always be ensured that no or only a negligibly low coupling occurs between different transverse propagation modes of the waveguide structure, since otherwise spectral instabilities and a loss of the single mode of the laser can occur. Furthermore, there can be high power losses in the resonator and thus a reduced efficiency of the laser. A corresponding waveguide structure should therefore enables mode-preserving guidance and reflection of electromagnetic waves. According to the invention, this condition is fulfilled by the adiabatic transition from a waveguide region of small width to a waveguide region of high width over an extended length (see Yunfei Fu et. al., "Efficient adiabatic silicon-on-insulator waveguide taper", Photon. Res. 2(3) (2014)). This ensures that the waveguide structure can function as a compact and efficient retroreflector for electromagnetic waves coupled into the waveguide structure. The effective length of a grating integrated into the waveguide structure can thus be significantly reduced. Preferably the width of the waveguide structure in the area of the grating corresponds to a multiple of the width of the waveguide structure in an area outside the grating.

An inventive waveguide structure can be used to reflect an electromagnetic wave guided in a waveguide wherever the type of guided transverse propagation mode and a particularly compact design of the associated optical system are important. Optical systems, which can include corresponding waveguide structures, include general waveguide-based interferometer structures, optical couplers, modulators, multiplexers/de-multiplexers, phase shifters or signal delayers.

Preferably, an inventive waveguide structure is integrated into the resonator of a semiconductor laser as a compact, highly reflective and mode-preserving frequency-selective feedback element.

Preferably the second waveguide region comprises an extended length along its longitudinal axis with a constant second width. Preferably, this area borders directly on the second face with the second width of the second waveguide area. Furthermore, the second waveguide area can also have several such extended length sections along its longitudinal axis. For example, the width of the second waveguide region along its longitudinal axis may expand from the first end face to a second end face to a second width greater than the first width, the expansion comprising individual intermediate portions having a constant third width and a constant fourth width, the third width and the fourth width each being greater than the first width and less than the second width.

Preferably the grating is arranged exclusively in the extended length section with the second width of the second waveguide region. It is also preferred that the grating is distributed over the entire second waveguide area. The grating is particularly preferred to be located exclusively in a section of the second waveguide range with a non-constant width.

Preferably, the multitude of webs and trenches of the grating extend over the entire width of the second waveguide area. In another preferred design of the grating, the numerous webs and trenches of the grating do not extend across the entire width of the second waveguide area, at least in sections. It is preferred that the webs and trenches of the grating are arranged exclusively in the region of the outer sides of the second waveguide region, the width of such a web or trench resulting from the sum of the individual segments of the web or trench concerned. It is also preferred that the bars and trenches of the grating are arranged exclusively in the area of the middle of the second waveguide area. Both designs for the arrangement of the webs and trenches of the grating can also occur alternately in sections.

Preferably, the depth of the trenches and/or the width of the webs of the plurality of webs and trenches of the grating will each have constant or monotonously changing (nominal) values along the grating. In particular, these can be apodized gratings or so-called "chirped gratings".

The webs and trenches of the grating run parallel to an end face of the second waveguide area in particular. It is also preferred that the webs and trenches of the grating include an angle greater than 1°, greater than 5° or greater than 10° to an end face of the second waveguide region. Preferably this angle is less than 15°.

Preferably, the waveguides in the first and second waveguide ranges are stripe waveguides or ridge waveguides.

Preferably, the width w of the second waveguide region along its longitudinal axis widens from the first width w1 to the second width w2 according to $$w(x)=w_1+(a*(1-e^{b*h})+c*x^d); w(0)=w_1 \text{ and } w(1)=w_2$$

where x corresponds to a linear parameterization of the expansion length from 0 to 1 and a, b, c, d represent positive real numbers (including 0). The parameter value 0 corresponds to the origin of the longitudinal axis at the first face of the second waveguide area. The parameter value 1 corresponds to the expansion length as the maximum length of the longitudinal axis section of the second waveguide region on which the width w of the second waveguide region expands along its longitudinal axis from the first face to the second face to a second width w2 greater than the first width w1. The widening is therefore preferably done with potential or exponential growth fractions for the width of the second waveguide region. b and c determine the strength of the respective growth component, while a and c represent corresponding pre-factors for the fulfilment of the respective boundary conditions. Expansion is particularly preferred linear, purely potential, purely square or simply exponential. In particular, a purely potential expansion with a=0 and d≥1 is particularly preferred due to its simple producibility and a significantly decreasing influence of width on fashion conservation with the width of a tapering or expanding waveguide. Furthermore, it is particularly preferred that the width w of the second waveguide area along its longitudinal axis widens from the first width w1 to the second width w2 with a=0, c=1 and d=1. Also particularly preferred are expansions with a=0, c=0 and d=2 as well as a=1, b=1 and c=0.

BRIEF DESCRIPTION OF THE FIGURES

The invention is explained in the following examples using the corresponding drawings. Show it.

DETAILED DESCRIPTION OF THE INVENTION

Figure 1:
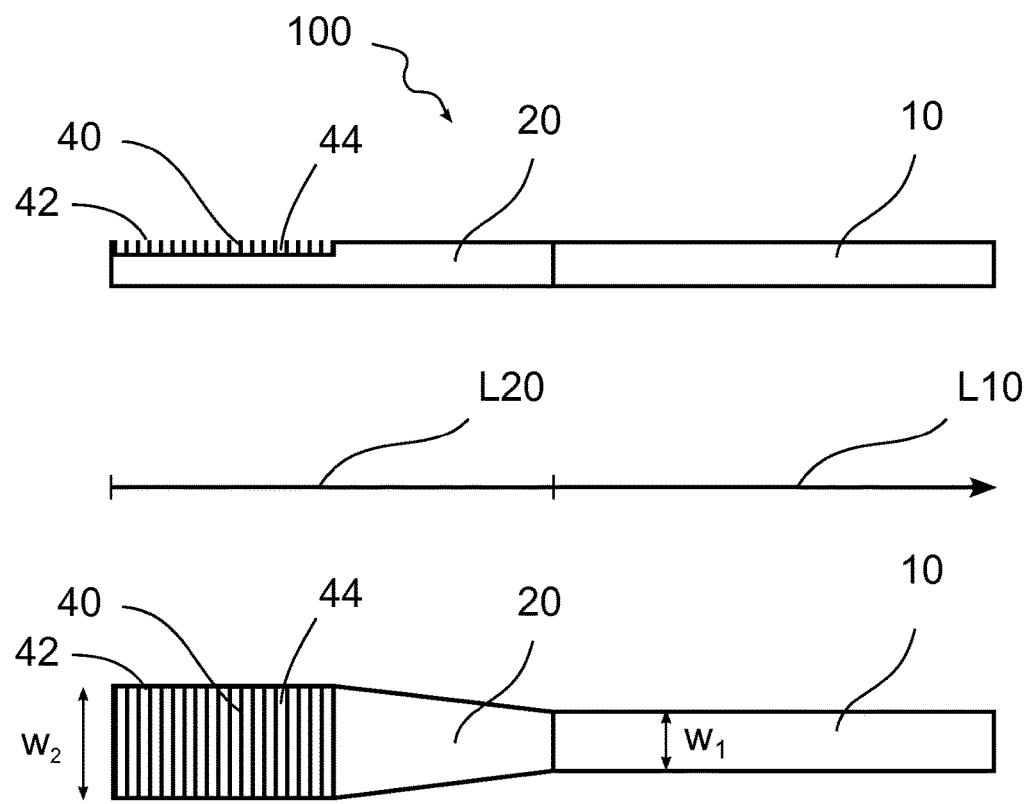
FIG. 1 a schematic representation of an initial design of an inventive waveguide structure in side view and top view.

FIG. 1 shows a schematic representation of a first design of an invention waveguide structure 100 in side view and top view. A first end face of a first waveguide region 10 having a constant first width w1 is joined to a first end face of a second waveguide region 20 having a width w1 equal to the first width w1 of the first waveguide region 10, the first waveguide region 10 and the second waveguide region 20 being adapted to guide electromagnetic waves along a first longitudinal axis L10 of the first waveguide region 10 and a second longitudinal axis L20 of the second waveguide region 20. A transition of an electromagnetic wave guided in at least one propagation mode from the first waveguide region 10 to the second waveguide region 20 (and vice versa) takes place in a mode-preserving manner.

The width w of the second waveguide region 20 widens along its longitudinal axis L20 from the first face to a second face to a second width w2 greater than the first width w1 trapezoidal, the second waveguide region 20 comprising along its longitudinal axis L20 an extended length with a constant second width w2. Within this length section, a grating 40 is arranged with a large number of webs 42 and trenches 44. The waveguide structure 100 shown here is preferably a ridge waveguide. The individual trenches 44 of the grating 40 can preferably be inserted into the ridge of the ridge waveguide, for example by selective etching.

The waveguide structure 100 shown is aligned to provide a common longitudinal axis L10, L20 of the waveguide structure 100 as a linear connection between the first longitudinal axis L10 of the first waveguide region 10 and the second longitudinal axis L20 of the second waveguide region 20.

Figure 2:
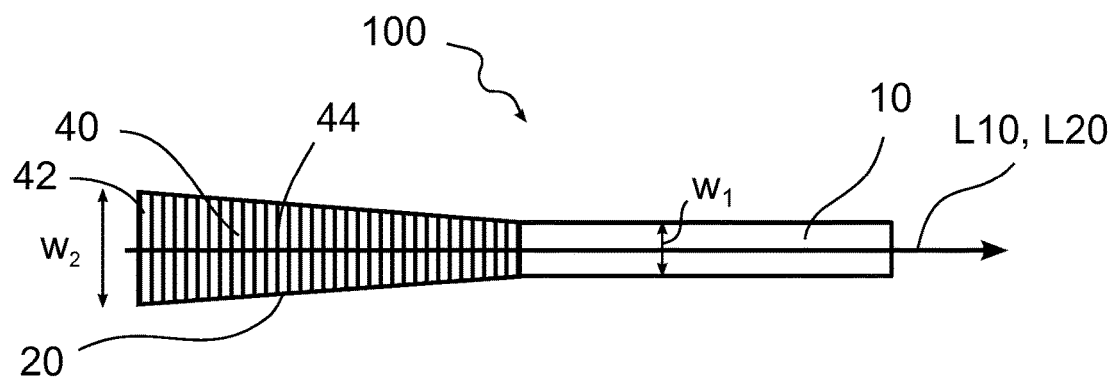
FIG. 2 a schematic representation of a second design of an invented waveguide structure.

FIG. 2 shows a schematic representation of a second design form of an invention waveguide structure 100. The representation largely corresponds to the design form shown in FIG. 1. The individual reference signs and their assignment apply accordingly. The width w of the second waveguide region 20 also widens along its longitudinal axis L20 from a first face to a second face to a second width w2 greater than the first width w1 trapezoidal, but the second waveguide region 20 does not comprise an extended length with a constant second width w2 along its longitudinal axis L20. The grating 40 of this design extends completely along the longitudinal axis L20 of the second waveguide area 20.

Figure 3:
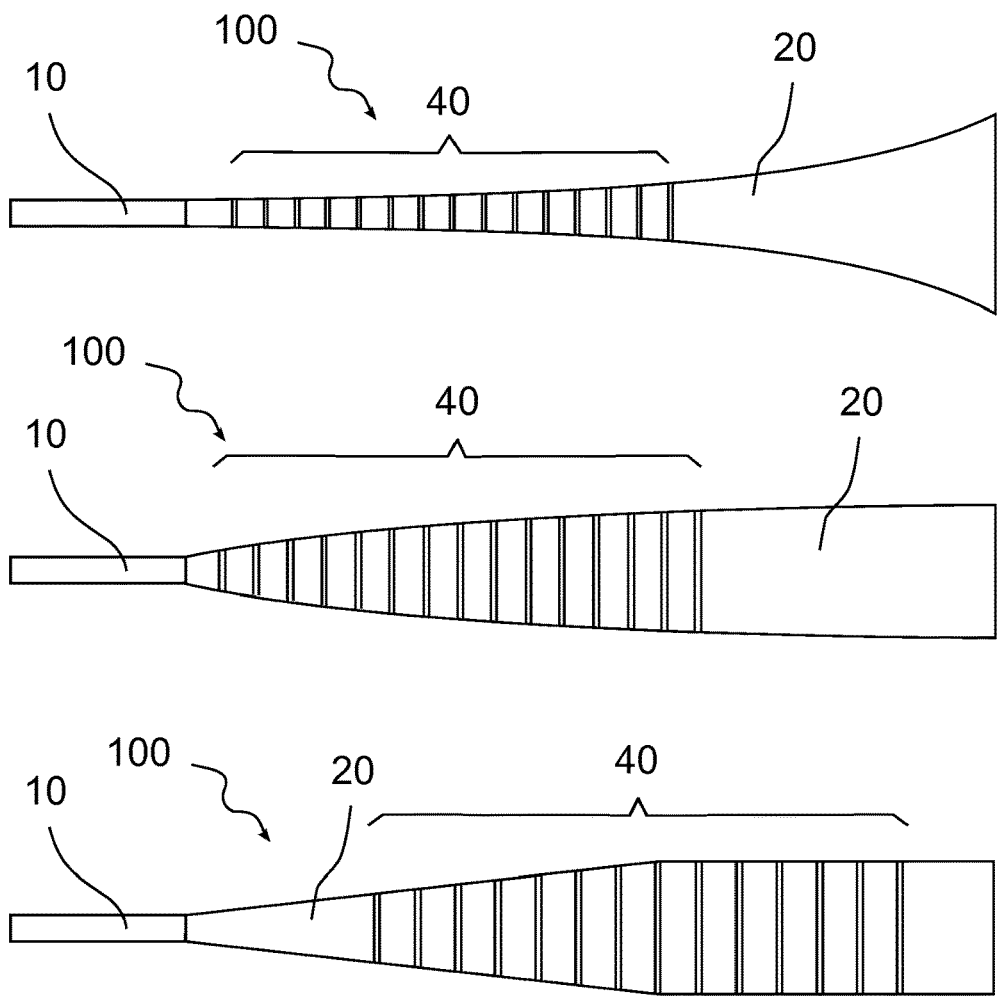
FIG. 3 schematic representations of further forms of waveguide structures according to the invention.

FIG. 3 shows schematic representations of other designs of invention waveguide structures 100. The representations largely correspond to the designs of invention waveguide structures 100 shown in FIGS. 1 and 2. The individual reference signs and their assignment apply accordingly. Differences result in particular in the shape of the widening of the width (top and middle) of the second waveguide region 20 and in the arrangement (bottom) of the grating (40) within the second waveguide region 20.

Figure 4:
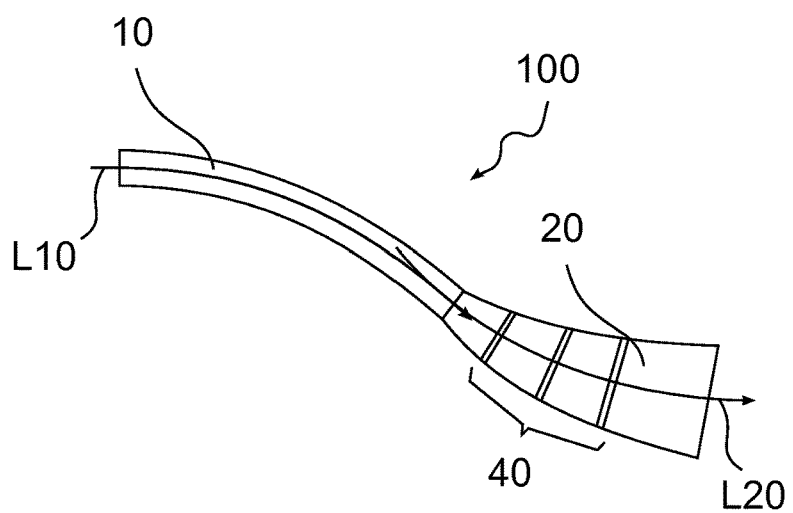
FIG. 4A schematic representation of a curved version of an invention waveguide structure.

FIG. 4 shows a schematic representation of a curved version of a Invented Waveguide Structure 100. The illustrations largely correspond to the version of an Invented Waveguide Structure 100 shown in FIG. 2. The individual reference signs and their assignment apply accordingly. The longitudinal axis L10 of the first waveguide area 10 and the longitudinal axis L20 of the second waveguide area 20 are shown curved. The common longitudinal axis L10, L20 of the waveguide structure 100 is thus also curved. Such a curved version of an inventive waveguide structure 100 can be used in particular to spatially separate the waveguide paths branching off from a directional coupler. The type of curvature can be varied freely, but the condition of a mode-preserving guidance of electromagnetic waves must be fulfilled according to the invention. With regard to the subsequent determination of a maximum permissible radius of curvature, the adiabaticity criterion specified for the widening applies corresponding to a transition between individual guided modes and leaky modes of a waveguide range.

Figure 5:
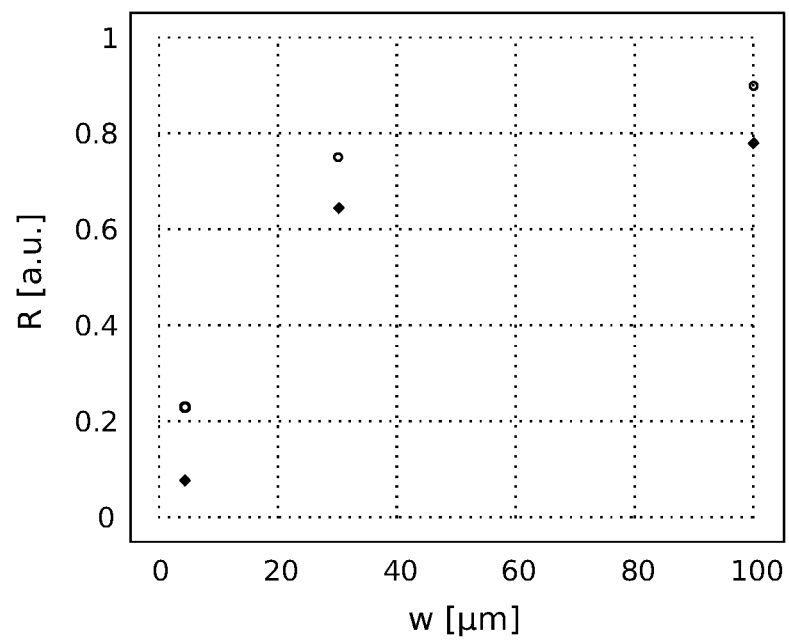
FIG. 5A graphical representation of the dependence between the reflectivity of the grating and the waveguide width.

FIG. 5 shows a graphical representation of the dependence between the reflectivity R of the grating and the waveguide width w. This is the result of measurements on DBR-RW lasers with a wavelength of $\lambda=975$ nm, whereby different widths of the ridge waveguide in the area of the grating were investigated. The gratings were 3rd order (○) and 8th order (♦) reflection gratings integrated into the ridge waveguides with a total grating length of 1 mm. The reflectivities shown were determined from the ratio of the power on the back and front side of the ridge waveguide. The reflectivity of the grating increases with the width of the ridge waveguide, whereby the reflectivity rises to just under 80% (♦) or 90% (○) with a waveguide width of 100 μm (~100λ). With a waveguide width of about 2 μm (~20λ), only about 8% (♦) or 24% (○) reflectivity is achieved. Preferably the waveguide width is in a range between ~20λ and ~40λ.

Figure 6:
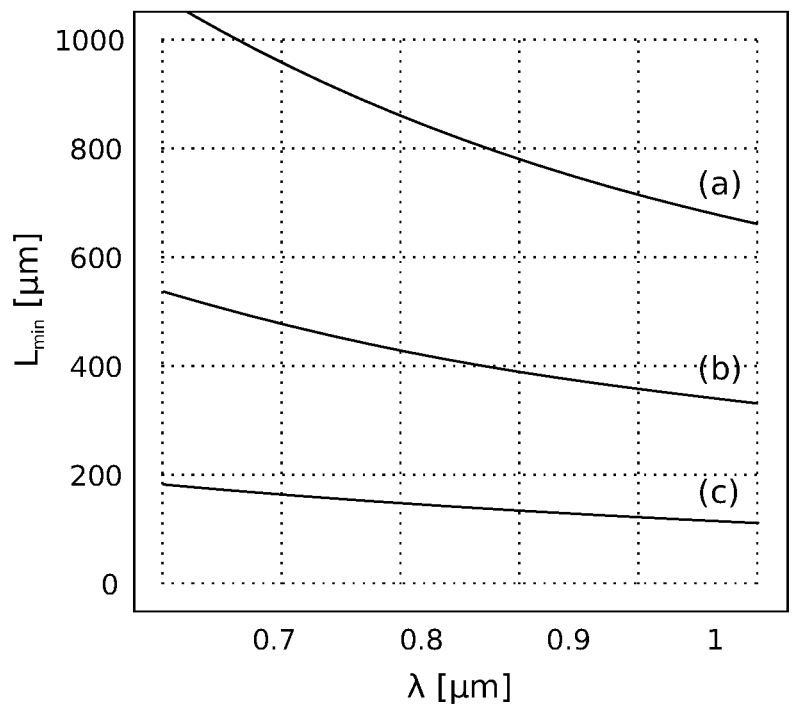
FIG. 6A graphical representation of the minimum expansion length required as a function of wavelength and waveguide width for trapezoidal expansion.

FIG. 6 shows a graphical representation of the minimum required expansion length Lmin as a function of the wavelength λ and the waveguide width for trapezoidal expansion. The calculations shown are based on the results of Yunfei Fu et. al. ("Efficient adiabatic silicon-on-insulator waveguide taper", Photon. Res. 2(3) (2014)) and show the requirements for the length of a trapezoidally widened second waveguide region for a mode-maintaining waveguide at different wavelengths. At a wavelength of about 1 μm, a trapezoidal widening for a waveguide with a first width w1=3 μm (a) to a second width w2=20 μm (~20λ) results in a minimum required widening length of about 700 μm, (b) to a second width w2=15 μm (~15λ) results in a minimum required widening length of about 350 μm and (c) to a second width w2=10 μm (~10λ) results in a minimum required widening length of about 100 μm. Preferably the expansion length lies in a range between 500 μm and 1500 μm.

Figure 7:
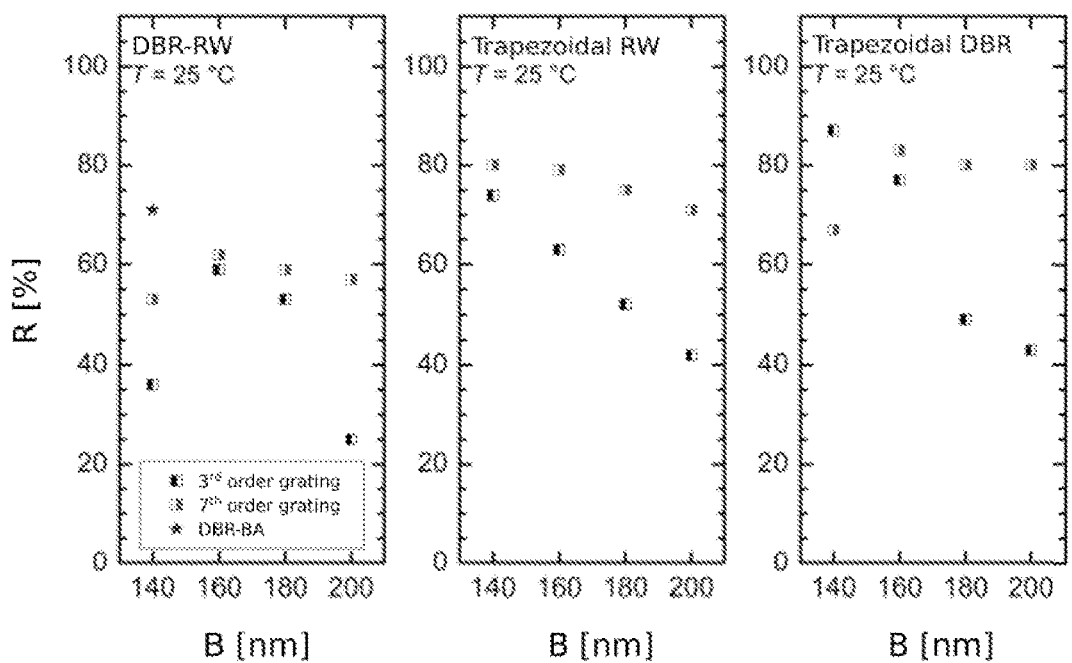
FIG. 7 Graphical representation of the reflectivities of different versions of an invented semiconductor laser.

FIG. 7 shows graphical representations of the reflectivities R of different versions of an invented semiconductor laser. In particular, the achieved reflectivities of gratings in standard design (DBR-RW, left Fig.), in the first variant according to the invention shown in FIG. 1 (trapezoidal-RW, middle picture) and in the second variant according to the invention shown in FIG. 2 (trapezoidal-DBR, right Fig.) are compared. It should be noted that the etching depth of the grating is indirectly hidden behind the lacquer opening B applied along the x-axis (the larger the lacquer opening B, the greater the etching depth). It can be seen that the reflectivity can be significantly increased compared to the standard DBR-RW version by widening the grating. It can also be seen from the individual illustrations that the respective maximum reflection is reached with an average lacquer opening B. The maximum reflection is reached with an average lacquer opening B. The maximum reflection is achieved with a maximum reflection with an average lacquer opening B. The wavelength of each laser was $\lambda=1030$ nm. The gratings integrated in the waveguide structures according to the invention were gratings for the 3rd order and the 7th order.

Figure 8:
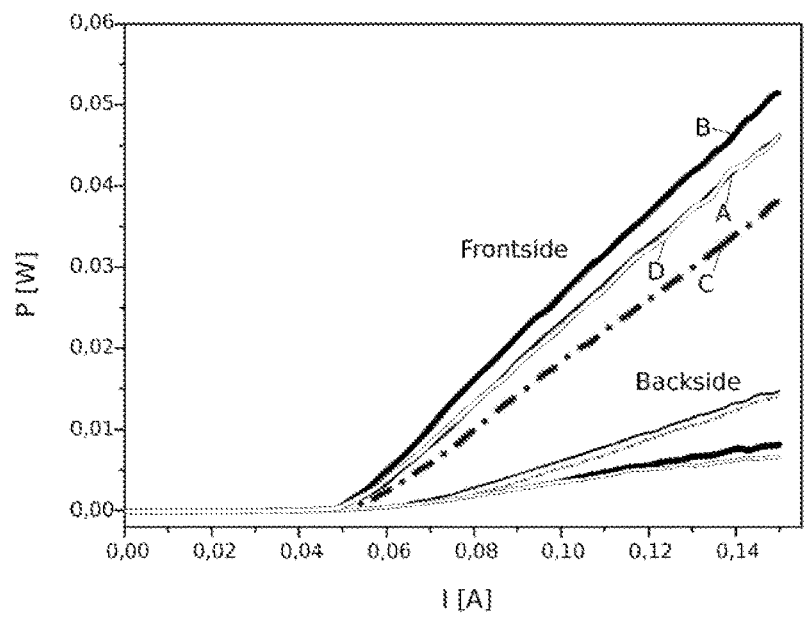
FIG. 8 Characteristic curves from pulse measurements on bars of different designs of an invented semiconductor laser of a first wavelength.

FIG. 8 shows characteristic curves from pulse measurements on bars of various designs of an inventive semiconductor laser with a first wavelength of $\lambda=660$ nm. A measurement was made on both the front and the back of the semiconductor laser.

Figure 9:
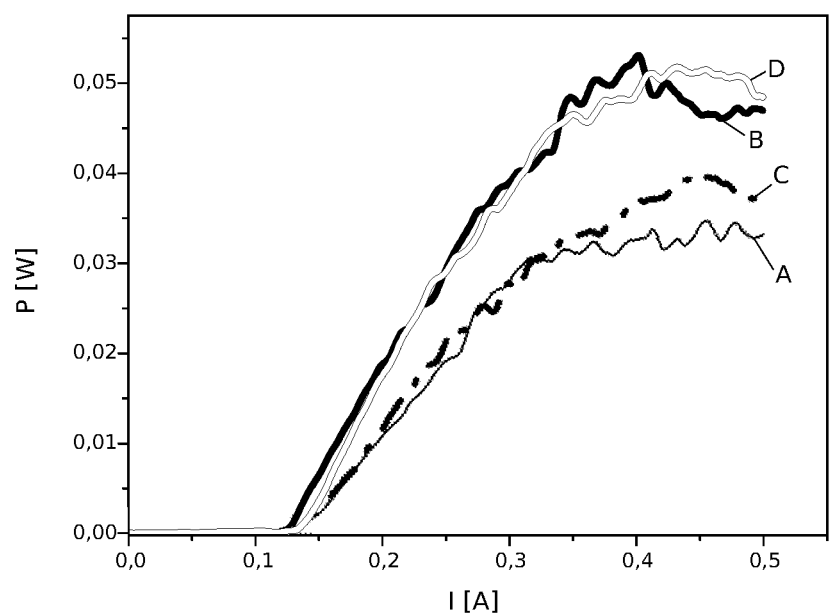
FIG. 9 Characteristic curves from pulse measurements on bars of different designs of a semiconductor laser of a second wavelength according to the invention.

FIG. 9 shows characteristic curves from pulse measurements on bars of different designs of an inventive semiconductor laser with a second wavelength of $\lambda=635$ nm. In both diagrams, several characteristic curves of the same type of semiconductor laser are averaged in order to clearly work out the effect of the widened grating and to gain higher statistical certainty. The laser diodes designated as grades A and C each have non-expanded gratings, while grades B and D were trapezoidally expanded from 5 μm to 10 μm at 500 μm expansion length. With types B and D, the output powers achieved are higher in each case due to improved reflectivity of the gratings, while at the same time the power emitted from the rear (grating side) is lowest (see FIG. 8).

REFERENCE CHARACTER LIST

10 first waveguide region
20 second waveguide range
40 grating
42 webs (bars)

44 trenches
100 waveguide structure
B lacquer opening
L10 Longitudinal axis of the first waveguide region
L20 Longitudinal axis of the second waveguide range
w width

The invention claimed is:
1. A waveguide structure comprising,
a first waveguide region having a constant first width adapted to guide electromagnetic waves mode sustainably along its longitudinal axis;
a second waveguide region adapted to guide electromagnetic waves mode sustainably along its longitudinal axis,
wherein the longitudinal axis of the first waveguide region and the longitudinal axis of the second waveguide region form a common longitudinal axis of the waveguide structure, wherein a first end face of the first waveguide region and a first end face of the second waveguide region are aligned with each other, wherein a width of the first face of the second waveguide region corresponds to the first width, and a width of the second waveguide region widens along its longitudinal axis from the first face to a second face to a second width greater than the first width; and
a grating having a plurality of webs and trenches, the grating being disposed along the common longitudinal axis in the second waveguide region;
wherein the second waveguide region and the grating are adapted to guide electromagnetic waves in the second waveguide region along the common longitudinal axis in a mode-maintaining manner and to reflect them in a mode-maintaining manner; and the first waveguide region, the second waveguide region and the grating are adapted to guide electromagnetic waves in the first waveguide region and in the second waveguide region along the common longitudinal axis in a mode-maintaining manner and to reflect them in a mode-maintaining manner;
wherein the first waveguide region, the second waveguide region, and the grating are adapted to cause a mode-maintaining reversal of direction for at least one transverse propagation mode of the first waveguide region excited at a second end face of the first waveguide region.
2. The waveguide structure of claim 1, wherein the second waveguide region comprises along its longitudinal axis an extended length portion having a constant second width.
3. The waveguide structure of claim 2, wherein the grating is disposed exclusively in the extended length portion having the second width of the second waveguide region.
4. The waveguide structure of claim 1, wherein the plurality of webs and trenches of the grating extend over the entire width of the second waveguide region or at least in portions do not extend over the entire width of the second waveguide region.
5. The waveguide structure of claim 1, wherein the plurality of webs and trenches of the grating are arranged parallel to an end face of the second waveguide region.
6. The waveguide structure of claim 1, wherein the waveguides in the first and second waveguide regions are strip waveguides or ribbed waveguides.
7. The waveguide structure of claim 1, wherein the depth of the trenches and the width of the webs of the plurality of webs and trenches of the grating are respectively constant.

8. The waveguide structure of claim 1, wherein the width w of the second waveguide region along its longitudinal axis changes from the first width w1 to the second width w2 according to formula (1)

$$w(x) = w_1 + (a^*(1-e^{b^*x}) + c^*x^d); \; w(0) = w_1 \text{ and } w(1) = w_2 \quad (1)$$

where x corresponds to a linear parameterization of the expansion distance from 0 to 1 and a, b, c, d represent positive real numbers.

9. A resonator type semiconductor laser, the resonator comprising a waveguide structure comprising:
a first waveguide region having a constant first width adapted to guide electromagnetic waves mode sustainably along its longitudinal axis;
a second waveguide region adapted to guide electromagnetic waves mode sustainably along its longitudinal axis,
wherein the longitudinal axis of the first waveguide region and the longitudinal axis of the second waveguide region form a common longitudinal axis of the waveguide structure, wherein a first end face of the first waveguide region and a first end face of the second waveguide region are aligned with each other, wherein a width of the first face of the second waveguide region corresponds to the first width, and a width of the second waveguide region widens along its longitudinal axis from the first face to a second face to a second width greater than the first width; and
a grating having a plurality of webs and trenches, the grating being disposed along the common longitudinal axis in the second waveguide region;
wherein the second waveguide region and the grating are adapted to guide electromagnetic waves in the second waveguide region along the common longitudinal axis in a mode-maintaining manner and to reflect them in a mode-maintaining manner; and the first waveguide region, the second waveguide region and the grating are adapted to guide electromagnetic waves in the first waveguide region and in the second waveguide region along the common longitudinal axis in a mode-maintaining manner and to reflect them in a mode-maintaining manner;
wherein the first waveguide region, the second waveguide region, and the grating are adapted to cause a mode-maintaining reversal of direction for at least one transverse propagation mode of the first waveguide region excited at a second end face of the first waveguide region.

10. An optical system comprising a waveguide structure comprising:
a first waveguide region having a constant first width adapted to guide electromagnetic waves mode sustainably along its longitudinal axis;
a second waveguide region adapted to guide electromagnetic waves mode sustainably along its longitudinal axis,
wherein the longitudinal axis of the first waveguide region and the longitudinal axis of the second waveguide region form a common longitudinal axis of the waveguide structure, wherein a first end face of the first waveguide region and a first end face of the second waveguide region are aligned with each other, wherein a width of the first face of the second waveguide region corresponds to the first width, and a width of the second waveguide region widens along its longitudinal axis from the first face to a second face to a second width greater than the first width; and a grating having a plurality of webs and trenches, the grating being disposed along the common longitudinal axis in the second waveguide region;

wherein the second waveguide region and the grating are adapted to guide electromagnetic waves in the second waveguide region along the common longitudinal axis in a mode-maintaining manner and to reflect them in a mode-maintaining manner; and the first waveguide region, the second waveguide region and the grating are adapted to guide electromagnetic waves in the first waveguide region and in the second waveguide region along the common longitudinal axis in a mode-maintaining manner and to reflect them in a mode-maintaining manner;

wherein the first waveguide region, the second waveguide region, and the grating are adapted to cause a mode-maintaining reversal of direction for at least one transverse propagation mode of the first waveguide region excited at a second end face of the first waveguide region.

* * * * *